United States Patent
Jeong

(10) Patent No.: US 9,699,907 B2
(45) Date of Patent: Jul. 4, 2017

(54) SEMICONDUCTOR PACKAGE MODULES, MEMORY CARDS INCLUDING THE SAME, AND ELECTRONIC SYSTEMS INCLUDING THE SAME

(71) Applicant: SK hynix Inc., Icheon-si, Gyeonggi-do (KR)

(72) Inventor: Jung Tae Jeong, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 91 days.

(21) Appl. No.: 14/813,359

(22) Filed: Jul. 30, 2015

(65) Prior Publication Data
US 2016/0295698 A1 Oct. 6, 2016

(51) Int. Cl.
| H05K 7/10 | (2006.01) |
| H05K 9/00 | (2006.01) |
| H05K 1/18 | (2006.01) |
| H05K 3/34 | (2006.01) |
| H01L 23/498 | (2006.01) |

(52) U.S. Cl.
CPC ........ H05K 1/181 (2013.01); H01L 23/49811 (2013.01); H05K 3/3436 (2013.01); *H01L 2224/16225* (2013.01); *H01L 2224/32225* (2013.01); *H01L 2224/73204* (2013.01); *H01L 2924/15174* (2013.01); *H01L 2924/181* (2013.01); *H05K 2201/10287* (2013.01); *H05K 2201/10719* (2013.01); *H05K 2201/10727* (2013.01); *H05K 2203/049* (2013.01)

(58) Field of Classification Search
USPC .................................. 361/767, 752; 174/557
See application file for complete search history.

(56) References Cited

U.S. PATENT DOCUMENTS

| 6,032,356 | A | 3/2000 | Eldridge et al. | |
| 2004/0201075 | A1* | 10/2004 | Thurgood | H01L 23/13 257/459 |
| 2010/0300742 | A1* | 12/2010 | Ihara | H01R 12/57 174/261 |
| 2015/0124420 | A1* | 5/2015 | Heinrich | H05K 1/11 361/767 |

* cited by examiner

*Primary Examiner* — Andargie M Aychillhum
(74) *Attorney, Agent, or Firm* — William Park & Associates Ltd.

(57) ABSTRACT

A semiconductor package module may include a first substrate, and a second substrate disposed to face the first substrate. The semiconductor package module may include an interconnection member electrically connecting the first substrate to the second substrate and including a plurality of wires. Portions of the plurality of wires may be twisted and wound together and may be bent to extend in a predetermined direction.

18 Claims, 10 Drawing Sheets

SEMICONDUCTOR PACKAGE MODULES, MEMORY CARDS INCLUDING THE SAME, AND ELECTRONIC SYSTEMS INCLUDING THE SAME

CROSS-REFERENCE TO RELATED APPLICATION

The present application claims priority under 35 U.S.C 119(a) to Korean Application No. 10-2015-0047557, filed on Apr. 3, 2015, in the Korean intellectual property Office, which is incorporated herein by reference in its entirety as set forth in full.

BACKGROUND

1. Technical Field

Embodiments of the present disclosure generally relate to semiconductor packages and, more particularly, to semiconductor package modules including interconnection members, memory cards including the same, and electronic systems including the same.

2. Related Art

As high performance electronic systems become scaled down and portable electronic systems are increasingly in demand, spaces where semiconductor devices occupy in the portable electronic systems have been reduced whereas multi-functional electronic systems have been required. Thus, compact and large capacity semiconductor memory devices have been continuously required.

In addition, as the interest in the portable and wearable electronics increases, flexibility of the electronic systems, that is, the electronic system can be bent or folded, becomes required. It is possible to reduce the thickness of the substrates or semiconductor chips arranged on the substrate to a thickness enough to allow bending. However, it is difficult to make interconnection members electrically connecting semiconductor chips and substrates with this type of flexibility. Tensile stress or compressive stress can be applied when the interconnection members are warped or twisted, thus the interconnection members can be separated from a connection pad or can be cut. When the interconnection members are separated from the connection pad or are broken, problems in the performance of the semiconductor package occurs and, furthermore reliability of the semiconductor package is damaged. Accordingly, a package structure capable of maintaining its electrical connections with regards to interconnection members is required even when the semiconductor chip or its substrate is warped or twisted.

SUMMARY

According to an embodiment, there may be provided a semiconductor package module. The semiconductor package module may include a first substrate, a second substrate disposed to face the first substrate, and an interconnection member electrically connecting the first substrate to the second substrate and including a plurality of wires. Portions of the plurality of wires may be twisted and wound together and may be bent to extend in a predetermined direction.

According to an embodiment, there may be provided a semiconductor package module. The semiconductor package module may include a circuit substrate having a surface. On the surface a bonding pad may be disposed. The semiconductor package module may include a semiconductor package including a semiconductor chip and may be disposed to face the bonding pad of the circuit substrate. The semiconductor package module may include an interconnection member electrically connecting the bonding pad of the circuit substrate to the semiconductor package and may include a plurality of wires. Portions of the plurality of wires may be twisted and wound together and may be bent to extend in a predetermined direction.

According to an embodiment, there may be provided a memory card including a semiconductor package module. The semiconductor package module may include a first substrate, and a second substrate disposed to face the first substrate. The semiconductor package module may include an interconnection member electrically connecting the first substrate to the second substrate and including a plurality of wires. Portions of the plurality of wires may be twisted and wound together and may be bent to extend in a predetermined direction.

According to an embodiment, there may be provided a memory card including a semiconductor package module. The semiconductor package module may include a circuit substrate. A bonding pad may be disposed on a surface of the circuit substrate. The semiconductor package module may include a semiconductor package including a semiconductor chip and disposed to face the bonding pad of the circuit substrate. The semiconductor package module may include an interconnection member electrically connecting the bonding pad of the circuit substrate to the semiconductor package and may include a plurality of wires. Portions of the plurality of wires may be twisted and wound together and may be bent to extend in a predetermined direction.

According to an embodiment, there may be provided an electronic system including a semiconductor package module. The semiconductor package module may include a first substrate, and a second substrate disposed to face the first substrate. The semiconductor package module may include an interconnection member electrically connecting the first substrate to the second substrate and may include a plurality of wires. Portions of the plurality of wires may be twisted and wound together and may be bent to extend in a predetermined direction.

According to an embodiment, there may be provided an electronic system including a semiconductor package module. The semiconductor package module may include a circuit substrate having a surface. On the surface a bonding pad may be disposed. The semiconductor package module may include a semiconductor package including a semiconductor chip and may be disposed to face the bonding pad of the circuit substrate. The semiconductor package module may include an interconnection member electrically connecting the bonding pad of the circuit substrate to the semiconductor package and may include a plurality of wires. Portions of the plurality of wires may be twisted and wound together and may be bent to extend in a predetermined direction.

According to an embodiment, there may be provided a semiconductor package module. The semiconductor package module may include a first substrate, a second substrate disposed to face the first substrate, and an interconnection member electrically connecting the first substrate to the second substrate and including a plurality of wires. Portions of the plurality of wires may be twisted and wound together to prevent the plurality of wires from disconnecting the first substrate from the second substrate.

DETAILED DESCRIPTION

Figure 1:
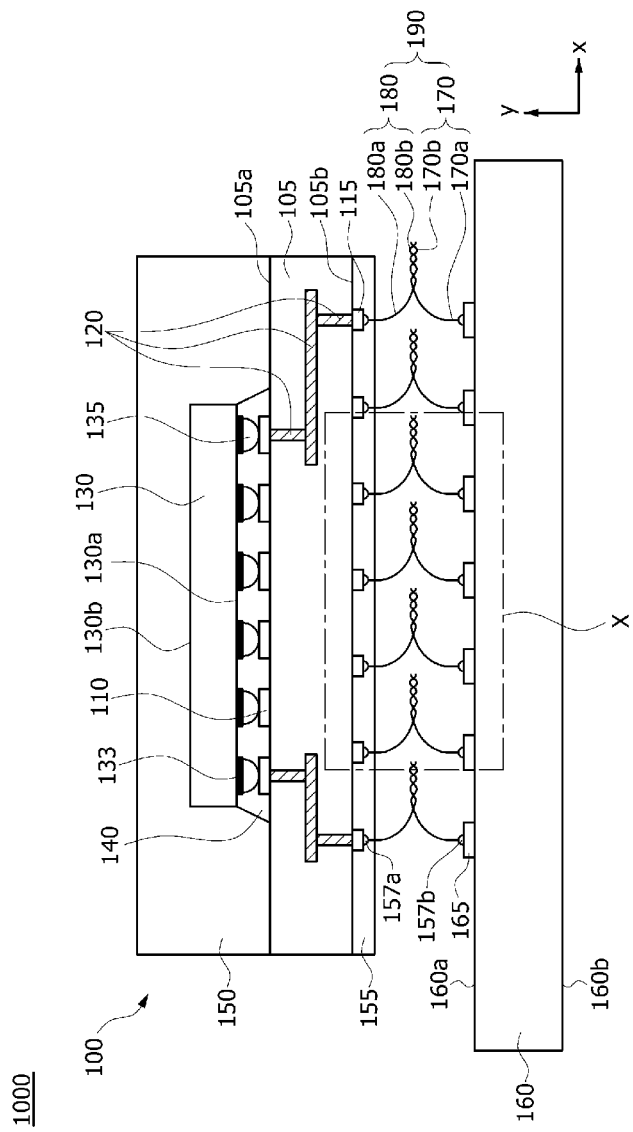
FIG. 1 is a cross-sectional view illustrating a representation of an example of a semiconductor package module according to an embodiment.

Various embodiments will now be described hereinafter with reference to the accompanying drawings; however, the embodiments may be embodied in different forms and should not be construed as limited to the embodiments set forth herein. Rather, these embodiments are provided so that this disclosure will be thorough and complete, and will fully convey the scope of the present disclosure to those skilled in the art.

Same reference numerals refer to same elements throughout the specification. Thus, even though a reference numeral is not mentioned or described with reference to a drawing, the reference numeral may be mentioned or described with reference to another drawing.

Various embodiments may be directed to semiconductor package modules including interconnection members, memory cards including the same, and electronic systems including the same.

Figure 2:
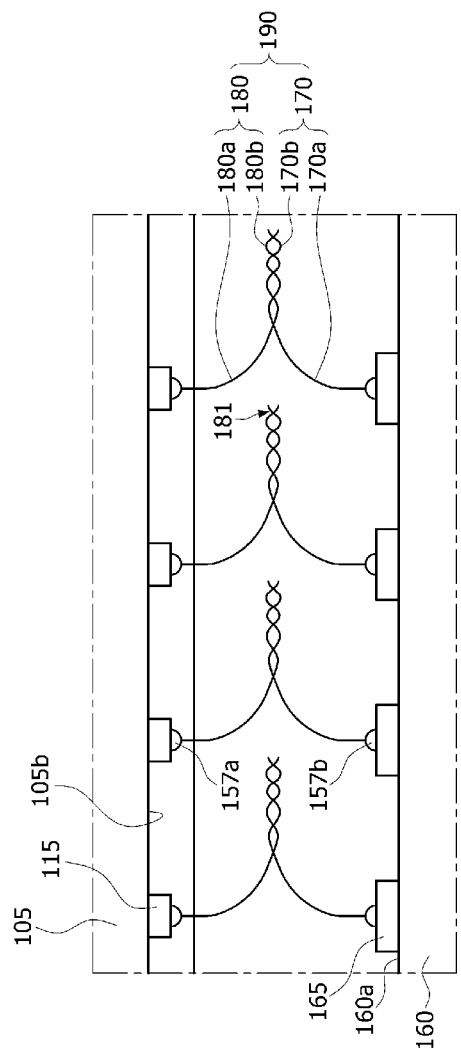
FIG. 2 is an enlarged view illustrating a portion "X" of a representation of an example of an interconnection structure employed in the semiconductor package module of FIG. 1.
Figure 3:
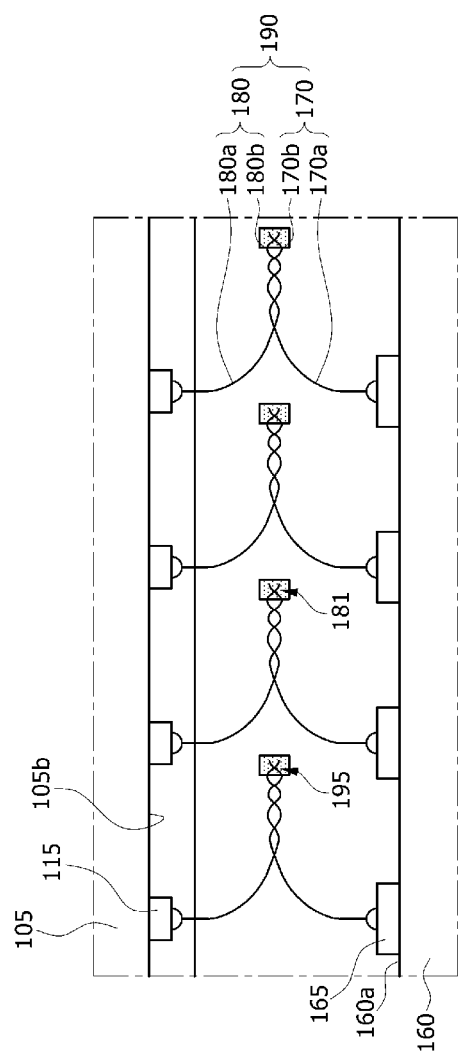
FIG. 3 is a cross-sectional view illustrating a representation of an example of the interconnection structure illustrated in FIG. 2.
Figure 4:
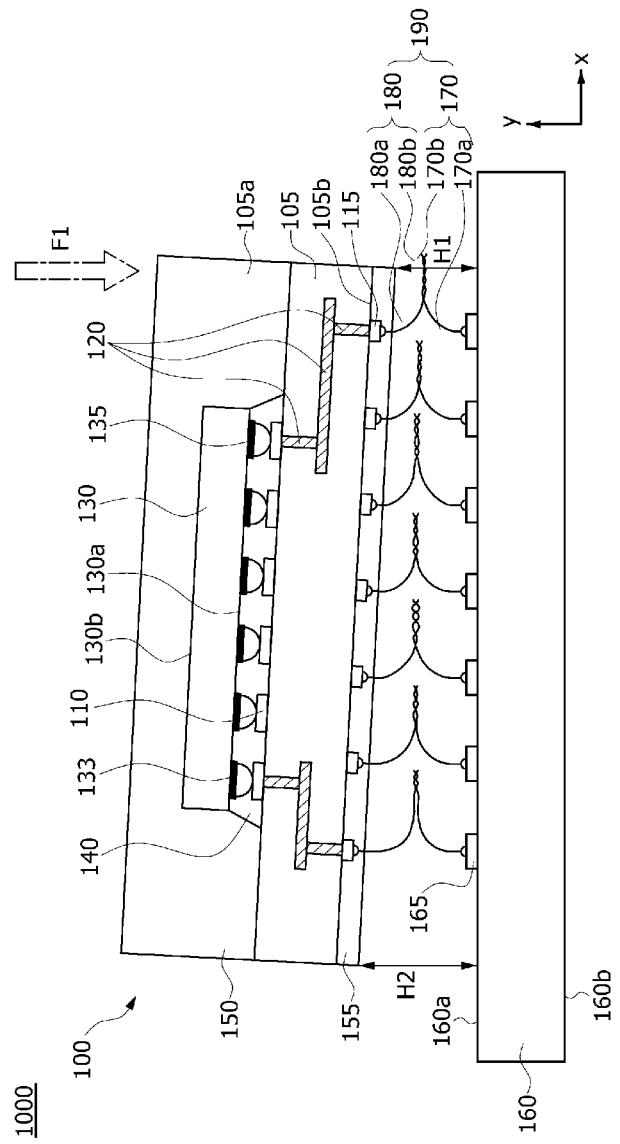
FIG. 4 is a cross-sectional view illustrating a representation of an example of a stress relief action of the semiconductor package module according to an embodiment.

FIG. 1 is a cross-sectional view illustrating a representation of an example of a semiconductor package module 1000 according to an embodiment. FIG. 2 is a cross-sectional view illustrating a portion "X" of FIG. 1. FIG. 3 is a cross-sectional view illustrating a representation of an example of the interconnection structure illustrated in FIG. 2. FIG. 4 is a cross-sectional view illustrating a representation of an example of a stress relief action of the semiconductor package module according to an embodiment.

Referring to FIGS. 1 and 2, the semiconductor package module 1000 may include a circuit substrate 160, a semiconductor package 100, and first interconnection members 190 electrically connecting the semiconductor package 100 to the circuit substrate 160.

The circuit substrate 160 may be a plate member including a front side surface 160a and a back side surface 160b that are opposite to each other. A plurality of bonding pads 165 may be disposed and spaced apart from each other on the front side surface 160a of the circuit substrate 160. The bonding pads 165 may include aluminum (Al) or copper (Cu).

The circuit substrate 160 may include, for example but not limited to, a printed circuit board (PCB), an organic substrate or an insulation substrate. If the circuit substrate 160 is a PCB, the circuit substrate 160 may include a rigid type PCB or a flexible type PCB. If the circuit substrate 160 is an insulation substrate, the circuit substrate 160 may include an insulation material. In an embodiment, the insulation material may include silicone having an elastic coefficient of about 19835.2 Mpa to about 25244.8 Mpa at a room temperature and an elastic coefficient of about 313.6 Mpa to about 1254.4 Mpa at a temperature over 200 degrees Celsius. If the circuit substrate 160 is an organic substrate, the circuit substrate 160 may include an organic material. In an embodiment, the organic material may include epoxy resin having an elastic coefficient of about 2.93 Mpa to about 3.73 Mpa at a room temperature and an elastic coefficient of about 0.82 Mpa to about 3.27 Mpa at a temperature over 200 degrees Celsius. In some embodiments, the circuit substrate 160 may be a multilayered PCB in which a plurality of circuit substrates are stacked. Although not illustrated in the drawings, other pads may be disposed on the back side surface 160b opposite to the front side surface 160a on which the bonding pads 165 are disposed and may be electrically connected to another semiconductor package module or an electronic component.

The semiconductor package 100 may be disposed on the front side surface 160a of the circuit substrate 160 so that a front side surface of the semiconductor package 100 faces the front side surface 160a of the circuit substrate 160. The semiconductor package 100 may include a semiconductor chip 130 mounted on a package substrate 105 and connection terminals 135 disposed between semiconductor chip 130 and the package substrate 105. The package substrate 105 may include a body part and may have a first surface 105a and a second surface 105b that are opposite to each other. The package substrate 105 may be a plate member including a PCB, an organic substrate or an insulation substrate.

First substrate pads 110 may be disposed on the first surface 105a of the package substrate 105. Second substrate pads 115 may be disposed on the second surface 105b of the package substrate 105 and may be connected to the first interconnection members 190. The first substrate pads 110 may be arranged in at least two columns on the first surface 105a of the package substrate 105 and spaced apart from each other, but are not limited thereto. The first substrate pads 110 or the second substrate pads 115 may include, for example but not limited to, Al or Cu.

First interconnection patterns 120 may be disposed in the package substrate 105 to electrically connect the first substrate pads 110 to the second substrate pads 115. For example, first ends the first interconnection patterns 120 may contact the first substrate pads 110 and second ends of the first interconnection pattern 120 may contact the second substrate pad 115. Each of the first interconnection patterns 120 may include a plurality of interconnection layers.

The semiconductor chip 130 may be disposed on the first surface 105a of the package substrate 105. Active devices such as transistors may be formed in the semiconductor chip 130. In some examples, passive devices such as capacitors and/or resistors may also be formed in the semiconductor chip 130. The semiconductor chip 130 may include a first surface 130a and a second surface 130b opposite to each other. An active surface of the semiconductor chip 130 is adjacent to the first surface 130a. Accordingly, the first surface 130a of the semiconductor chip 130 may correspond to a front side surface adjacent to active regions of the semiconductor chip 130, and the second surface 130b of the semiconductor chip 130 may correspond to a back side surface. Transistors (not illustrated) including gates and source/drain regions as well as circuit patterns (not illustrated) such as bit lines may be disposed on the first surface 130a of the semiconductor chip 130. Connection pads 133 may be additionally disposed on the first surface 130a of the semiconductor chip 130. The connection pads 133 may be formed of conductive material, for example, Al or Cu to electrically connect the semiconductor chip 130 to the package substrate 105. For example, the package substrate 105 and the semiconductor chip 130 may be electrically connected to each other through the connection pads 133 and the connection terminals 135. The connection terminals 135 may be disposed on the connection pads 133 and may be solder bumps. The connection terminals 135 may be attached to the first substrate pads 110 of the package substrate 105. A space between the package substrate 105 and the semiconductor chip 130 may be filled with an under-filling material 140.

A molding member 150 may be disposed on the first surface 105a of the package substrate 105 to cover the semiconductor chip 130. The molding member 150 may include Epoxy Molding Compound (EMC), hardener, and organic or inorganic filler. The molding member 150 may physically and chemically protect the semiconductor chip 130 and the package substrate 105 from external environment. An insulation pattern 155 may be disposed on the second surface 105b of the package substrate 105. The insulation pattern 155 may be disposed to cover the second substrate pad 115 on the second surface 105b of the package substrate 105. The insulation pattern 155 may include a solder resist material.

The circuit substrate 160 and the semiconductor package 100 may be electrically connected to each other through the first interconnection members 190. Each of the first interconnection members 190 may include wires 170 and 180. The wires 170 and 180 may be twisted together. Each of the wires 170 and 180 may include a plurality of strands. Referring to FIG. 2, each of the first interconnection members 190 may include a first wire portion 170 and a second wire portion 180. The first wire portion 170 may include a first line portion 170a extending in a vertical direction perpendicular or substantially perpendicular to the circuit substrate 160 and a first wave portion 170b extending from the first line portion 170a in a horizontal direction or substantially a horizontal direction to have a curved and twisted shape. The second wire portion 180 may include a second line portion 180a extending in a vertical direction perpendicular to or substantially perpendicular to the package substrate 105 and a second wave portion 180b horizontally extending or substantially horizontally extending from the second line portion 180a to have a curved shape twisted with the first wave portion 170b. Each of the first interconnection members 190 may include Au, Ag, or Cu.

The first wave portion 170b of the first wire portion 170 and the second wave portion 180b of the second wire portion 180 may be wound together into a spiral shape or substantially a spiral shape. In an embodiment, the first wave portion 170b and the second wave portion 180b are illustrated as being bent in one direction, for example, an X-axis (see FIG. 1), but it is not limited thereto. The first wave portion 170b and the second wave portion 180b may be twisted and wound together in a spiral shape to contact with each other. Accordingly the first wave portion 170b and the second wave portion 180b constituting each of the first interconnection members 190 may be electrically connected to each other. In an embodiment, the first wave portion 170b and the second wave portion 180b may be wound not to contact each other at their end portion 181. In an embodiment, the first wave portion 170b and the second wave portion 180b may be in contact with each other at the end portion 181. One end of the first interconnection member 190 may be connected to the second substrate pad 115 of the package substrate 105 through a first connection member 157a, and the other end of the first interconnection member 190 may be connected to the bonding pad 165 of the circuit substrate 160 through a second connection member 157b.

In an embodiment, as illustrated in FIG. 3, the first interconnection member 190 may include the first wave portion 170b and the second wave portion 180b wound together in a spiral shape, and may further include a protection member 195 at the end portion 181. The protection member 195 may be disposed to cover an exposed surface of the end portion 181 of the first interconnection member 190. The protection members 195 covering the end portions 181 of the first interconnection members 190 may prevent electrical connection between the first interconnection members 190 disposed to be adjacent to each other. In addition, the protection member 195 may fix the first wave portion 170b and the second wave portion 180b so that the first wave portion 170b and the second wave portion 180b are not separated from each other. In an embodiment, the protection member 195 may have a tube shape or substantially a tube shape. The protection member 195 may include an insulation material. In an embodiment, the protection member 195 may include polymer such as silicone.

The first interconnection member 190 may include a first wire 170 (or first wire portion 170) and a second wire 180 (or second wire portion 180) twisted together. A contact area between the first wire 170 and the second wire 180 may increase to reduce an electrical contact resistance value between the first wire 170 and the second wire 180. The first interconnection member 190 may not be detached from the second substrate pads 115 or the bonding pads 165 or may not be broken even though the semiconductor package module 1000 is bent or warped. For example, as illustrated in FIG. 4, when an external force F1 is locally applied to an edge of the semiconductor package module 1000, a distance between the semiconductor package 100 and the circuit substrate 160 at the edge of the semiconductor package module 1000 where the external force F1 is applied may be reduced to a first height H1. On the contrary, a distance between the semiconductor package 100 and the circuit substrate 160 at another edge of the semiconductor package module 1000 where the external force F1 is not applied may increase to a second height H2. The second height H2 may be greater than the first height H1.

Since the distance between the semiconductor package 100 and the circuit substrate 160 changes according to the position where the external force F1 is applied, a tensile stress may be applied to some of the first interconnection members 190 and a compressive stress may be applied to some others of the first interconnection members 190. For example, whereas a compressive stress may be applied to the first interconnection member 190 located in a portion where the external force F1 is applied, a tensile stress may be applied to the first interconnection member 190 located in a portion where the external force F1 is not applied. In the event that a tensile stress is applied to the first interconnection member 190, the first wave portion 170b and the second wave portion 180b of the first interconnection member 190 may be released or raveled to increase a total length of the first interconnection member 190. Thus, even though a distance between the semiconductor package 100 and the circuit substrate 160 increases to the second height H2 due to the external force F1, the first interconnection member 190 may not be broken or may not be separated from the second substrate pad 115 or the bonding pad 165. Accordingly, even if the external force F1 is applied to a portion of the semiconductor package module 1000, the semiconductor package module 1000 may absorb the external force F1 without any damage.

Figure 5:
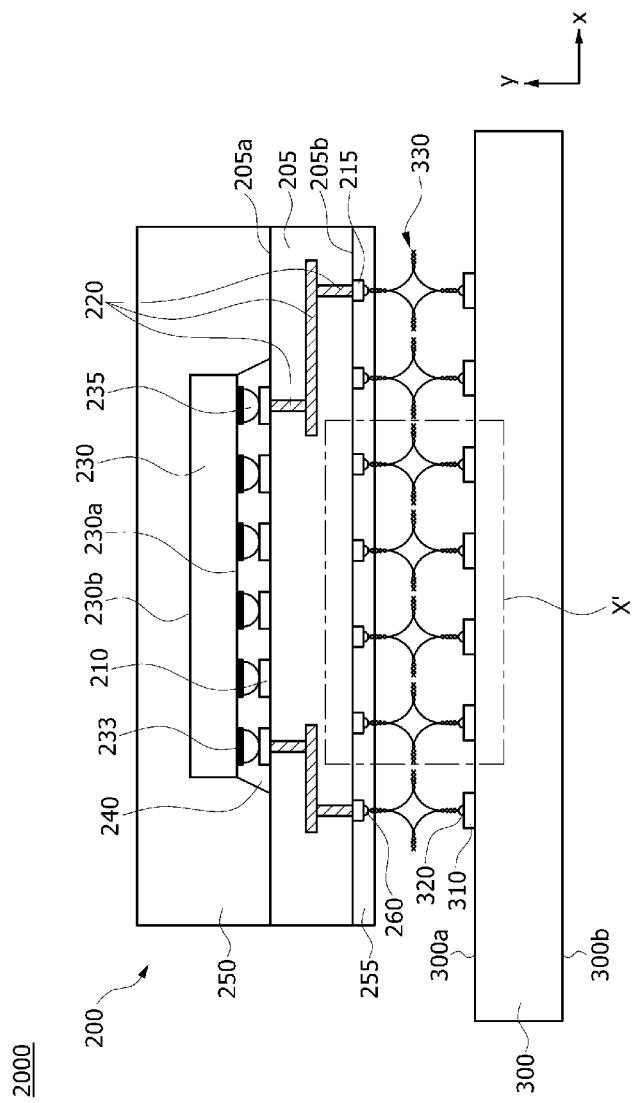
FIG. 5 is a cross-sectional view illustrating a representation of an example of a semiconductor package module according to an embodiment.
Figure 6:
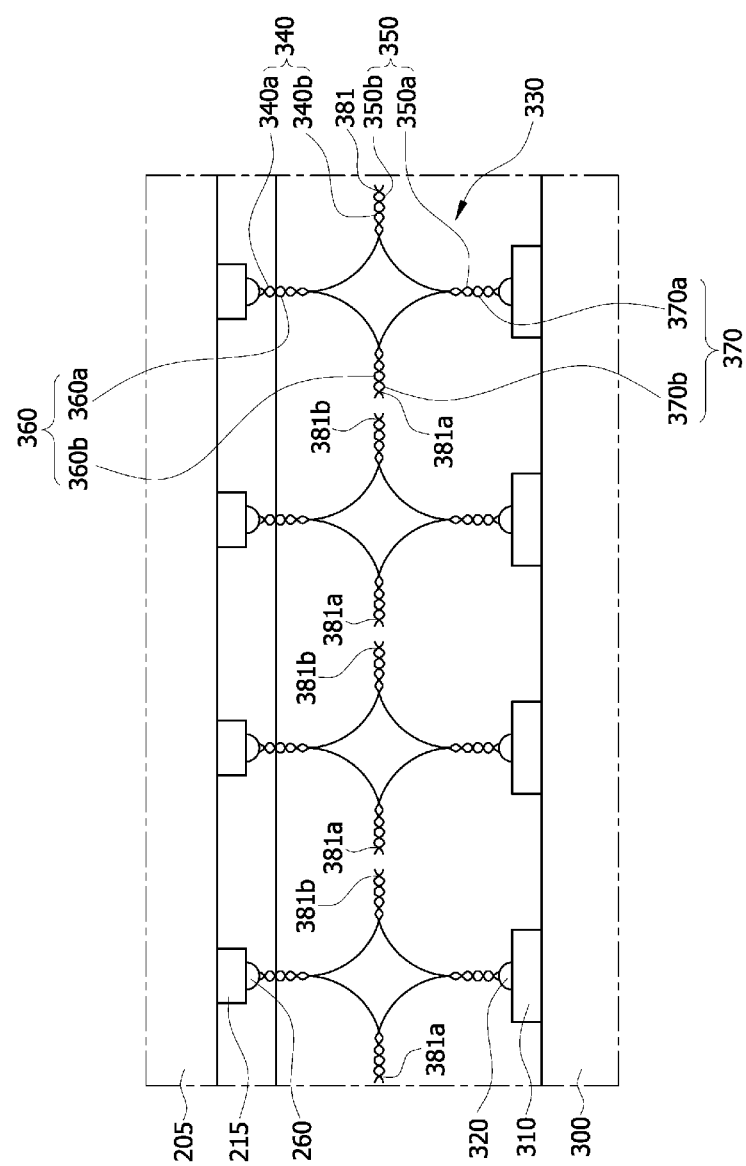
FIG. 6 is an enlarged view illustrating a portion "X" of a representation of an example of an interconnection structure employed in the semiconductor package module of FIG. 5.
Figure 7:
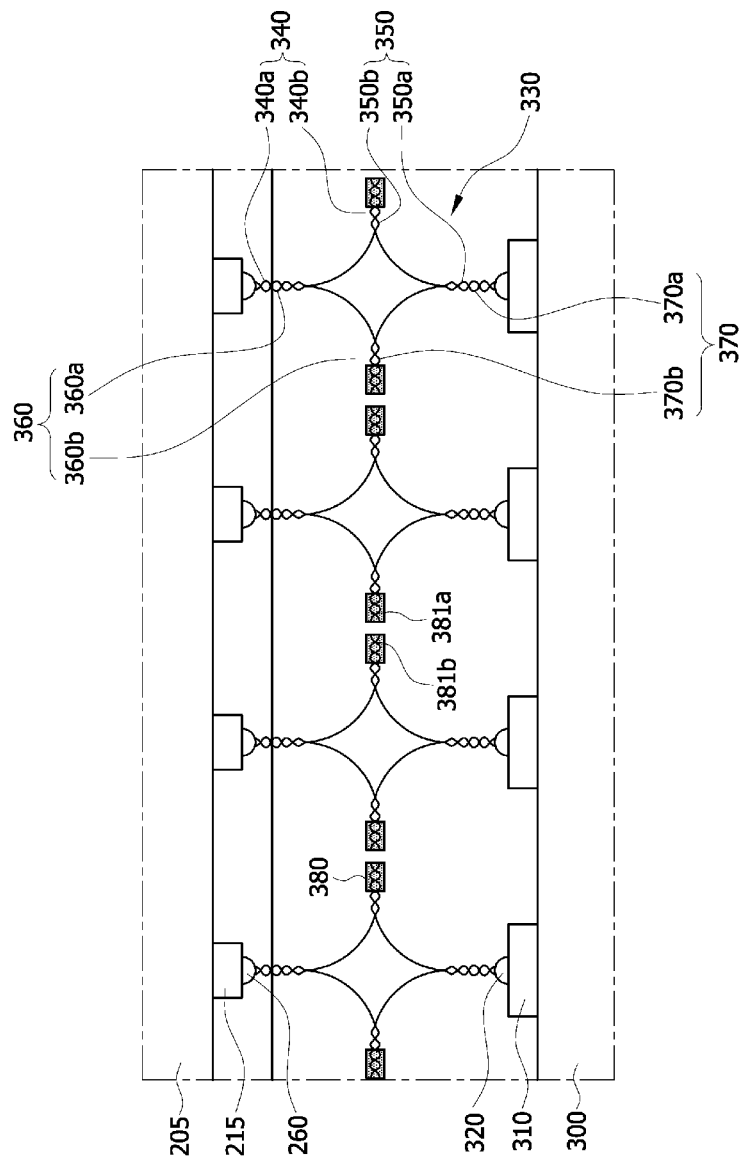
FIG. 7 is a cross-sectional view illustrating a representation of an example of the interconnection structure illustrated in FIG. 6.
Figure 8:
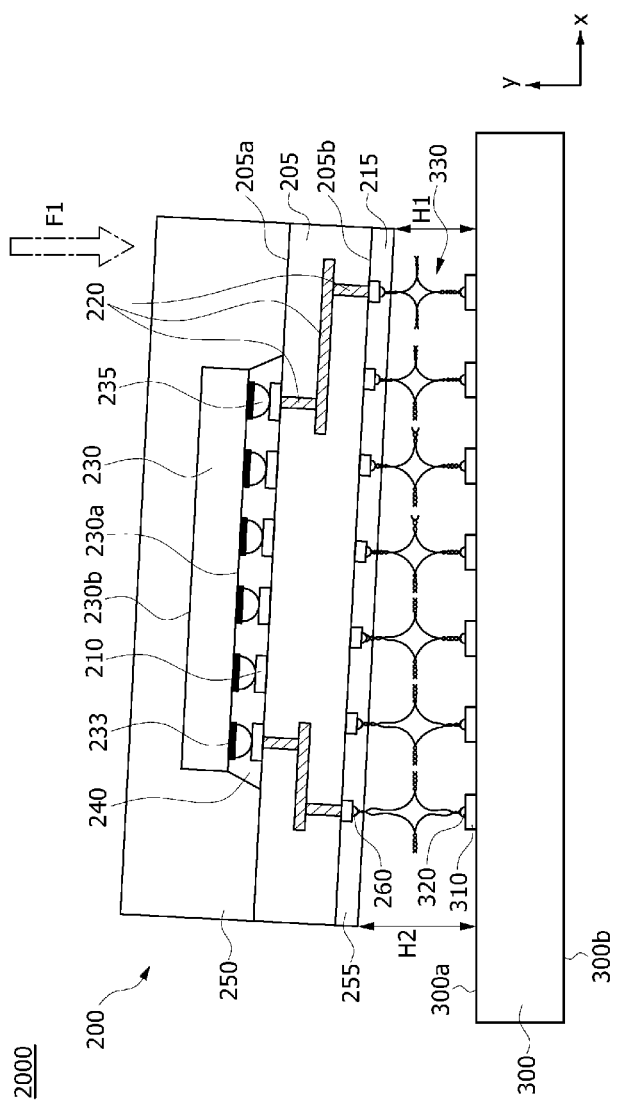
FIG. 8 is a cross-sectional view illustrating a representation of an example of a stress relief action of the semiconductor package module illustrated in FIG. 5.

FIG. 5 is a cross-sectional view illustrating a representation of an example of a semiconductor package module 2000 according to an embodiment. FIG. 6 is an enlarged view illustrating a portion "X'" of a representation of an example of an interconnection structure employed in the semiconductor package module 2000 of FIG. 5. FIG. 7 is a cross-sectional view illustrating a representation of an example of an interconnection member according to an embodiment. FIG. 8 is a cross-sectional view illustrating a representation of an example of a stress releasing action of the semiconductor package module 2000 illustrated in FIG. 5.

Referring to FIGS. 5 and 6, the semiconductor package module 2000 may include a circuit substrate 300, a semiconductor package 200, and second interconnection members 330 electrically connecting the circuit substrate 300 to the semiconductor package 200. The circuit substrate 300 may be a plate type member including a front side surface 300a and a back side surface 300b that are opposite to each other. A plurality of bonding pads 310 may be disposed on the front side surface 300a of the circuit substrate 300 spaced apart from each other. The bonding pad 310 may include Al or Cu. The circuit substrate 300 may include a PCB, an organic substrate or an insulation substrate. If the circuit substrate 300 is a PCB, the circuit substrate 300 may be a rigid type PCB or a flexible type PCB. If the circuit substrate 300 is an insulation substrate, the circuit substrate 300 may include an insulation material. In an embodiment, the insulation material may include silicone having an elastic coefficient of about 19835.2 Mpa to 25244.8 Mpa at a room temperature and having an elastic coefficient of about 313.6 Mpa to 1254.4 Mpa at a temperature over 200 degrees Celsius. If the circuit substrate 300 is an organic substrate, the circuit substrate 300 may include an organic material. In an embodiment, the organic material may include epoxy resin having an elastic coefficient of about 2.93 Mpa to 3.73 Mpa at a room temperature and having an elastic coefficient of about 0.82 Mpa to about 3.27 Mpa at a temperature over 200 degrees Celsius.

The semiconductor package 200 may be disposed on the circuit substrate 300. The semiconductor package 200 may include a semiconductor chip 230 mounted on a package substrate 205 and connection terminals 235 electrically connecting the semiconductor chip 230 to the package substrate 205. The package substrate 205 may include a first surface 205a and a second surface 205b opposite to each other. First substrate pads 210 may be disposed on the first surface 205a of the package substrate 205. Second substrate pads 215 connected to first ends of the second interconnection members 330 may be disposed on the second surface 205b. The first substrate pads 210 may be arranged in at least two columns on the first surface 205 of the package substrate 205 and may be spaced apart from each other. The first substrate pads 210 or the second substrate pads 215 may include Al or Cu. The package substrate 205 may include first interconnection patterns 220 therein. Each of the first interconnection patterns 220 may electrically connect the first substrate pad 210 to the second substrate pad 215.

The semiconductor chip 230 may be disposed on the first surface 205a of the package substrate 205. Active devices such as transistors may be formed in the semiconductor chip 230. In some examples, passive devices such as capacitors and/or resistors may also be formed in the semiconductor chip 230. The semiconductor chip 230 may include a first surface 230a and a second surface 230b opposite to each other. Connection pads 233 may be additionally disposed on the first surface 230a of the semiconductor chip 230. The connection pads 233 may be made of a conductive material, for example, Al or Cu.

The package substrate 205 and the semiconductor chip 230 may be electrically connected to each other through the connection pads 233 and the connection terminals 235. The connection terminals 235 may be, for example, solder bumps. The connection terminals 235 may be attached to the first substrate pads 210 of the package substrate 205. A space between the package substrate 205 and the semiconductor chip 230 may be filled with an under-filling material 240.

The first surface 205a of the package substrate 205 and the semiconductor chip 230 may be covered with a molding member 250. The molding member 250 may include Epoxy Molding Compound (EMC), hardener, and organic or inorganic filler. The molding member 250 may physically and chemically protect the package substrate 205 and the semiconductor chip 230 from external environment. An insulation pattern 255 may be disposed on the second surface 205b of the package substrate 205. The insulation pattern 255 may be disposed to cover the second substrate pads 215 and the second surface 205b of the package substrate 205. The insulation pattern 255 may include a solder resist material.

The circuit substrate 300 and the semiconductor package 200 may be electrically connected to each other through the second interconnection members 330. Each of the second interconnection members 330 may include a plurality of wire portions 340, 350, 360 and 370. The plurality of wire portions 340, 350, 360, and 370 may be twisted together. Referring to FIG. 6, each of the second interconnection members 330 may include a first wire portion 340, a second wire portion 350, a third wire portion 360 and a fourth wire portion 370. The first to fourth wire portions 340, 350, 360 and 370 may be connected to each other. For example, the first wire portion 340 may include a first wave portion 340a having a wave shape and a second wave portion 340b having a wave shape. The second wire portion 350 may include a third wave portion 350a having a wave shape and a fourth wave portion 350b having a wave shape. The third wire portion 360 may include a fifth wave portion 360a having a wave shape and a sixth wave portion 360b having a wave shape bent in a direction. The fourth wire portion 370 may include a seventh wave portion 370a having a wave shape and an eighth wave portion 370b having a wave shape.

The first wave portion 340a of the first wire portion 340 may be twisted and wound with the fifth wave portion 360a of the third wire portion 360 into a spiral shape or substantially a spiral shape to provide a first end of one of the second interconnection members 330. The second wave portion 340b of the first wire portion 340 may be twisted and wound with the fourth wave portion 350b of the second wire portion 350 into a spiral shape or substantially a spiral shape to provide a second end of one of the second interconnection members 330. The third wave portion 350a of the second wire portion 350 may be twisted and wound with the seventh wave portion 370a of the fourth wire portion 370 into a spiral shape or substantially a spiral shape to provide a third end of one of the second interconnection members 330. The eighth wave portion 370b of the fourth wire portion 370 may be twisted and wound with the sixth wave portion 360b of the third wire portion 360 into a spiral shape or substantially a spiral shape to provide a fourth end of one of the second interconnection members 330. For example, wave portions of the first wire portion 340, the second wire portion 350, the third wire portion 360 and the fourth wire portion 370 constituting each of the second interconnection members 330 may be twisted and wound with each other into a spiral shape or substantially a wire shape and may be connected with each other. Central parts of the first to fourth wire portions 340, 350, 360 and 370 constituting each of the second interconnection members 330 may be connected to each other to provide a lozenge shape or substantially a lozenge shape. Each of the second interconnection members 330 may comprise Au, Ag or Cu.

The first ends of the second interconnection members 330 may be electrically connected to the substrate pads 215 of the package substrate 205 through first connection members 260. The third ends of the second interconnection members 330 may be electrically connected to the bonding pads 310 of the circuit substrate 300 through second connection members 320. Each of the first to fourth wire portions 340, 350, 360 and 370 may include a plurality of strands that are twisted and wound together into a spiral shape or substantially a spiral shape and are in contact with each other. The plurality of strands constituting each of the first to fourth wire portions 340, 350, 360 and 370 may be electrically connected to each other. In some embodiments, the second ends 381b and the fourth ends 381a of the second interconnection members 330 may be electrically floated. The first ends of the second interconnection members 330 may extend from the package substrate 205 toward the circuit substrate 300, and the second ends of the second interconnection members 330 may extend from the circuit substrate 300 toward the package substrate 205. The third ends of the second interconnection members 330 may extend in a first direction parallel or substantially parallel with the surfaces of the package substrate 205 and the circuit substrate 300. The fourth ends 381a of the second interconnection members 330 may extend in a second direction corresponding to an opposite direction or substantially an opposite direction to the first direction.

In an embodiment, referring to FIG. 7, the second ends 381b and the fourth ends 381a of the second interconnection members 330 may be covered or substantially covered with protection members 380. The protection members 380 may disposed to cover only surfaces of the wave portions constituting the second ends 381b and the fourth ends 381a of the second interconnection members 330. In an embodiment, each of the protection members 380 may have a tube shape or substantially a tube shape. The protection members 380 may prevent the adjacent second interconnection members 330 from contacting each other. The protection members 380 may fix the wire portions 340, 350, 360 and 370 so that the wire portions 340, 350, 360 and 370 are not separated from each other. Each of the protection members 380 may include an insulation material. In an embodiment, the protection member 380 may include polymer such as silicone.

Each of the second interconnection members 330 may include the plurality of twisted wire portions 340, 350, 360 and 370, and each of the wire portions 340, 350, 360 and 370 may include a plurality of twisted strands. Accordingly, the second interconnection member 330 may have a relatively high tensile strength as compared with an example where each wire portion 340, 350, 360 or 370 of the second interconnection member 330 includes a single strand. Particularly, the first wave portion 340a and the fifth wave portion 360a are twisted and wound together to constitute the first end of the second interconnection member 330 and are connected to the second substrate pad 215 of the package substrate 205. The third wave portion 350a and the seventh wave portion 370a are twisted and wound together to constitute the third end of the second interconnection member 330 and are connected to the bonding pad 310 of the circuit substrate 300. Thus, as illustrated in FIG. 8, even if the external force F1 is applied to the package module 2000, electric connection between the circuit substrate 300 and semiconductor package 200 may be normally maintained without any failure because of the presence of the second interconnection members 330.

The semiconductor package module described above may be applied to various electronic systems.

Figure 9:
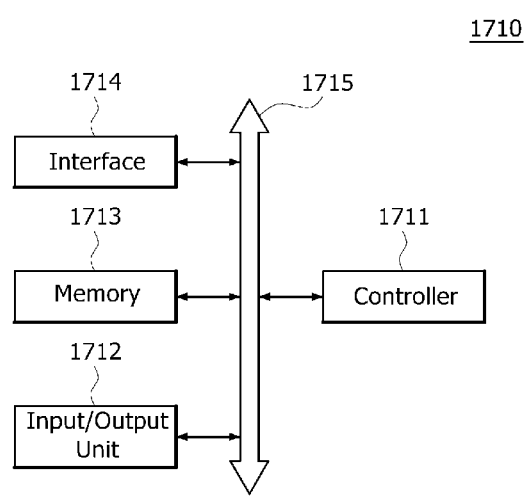
FIG. 9 is a block diagram illustrating a representation of an example of an electronic system including at least one of semiconductor package modules in accordance with some embodiments.

Referring to FIG. 9, the semiconductor package module in accordance with an embodiment may be applied to an electronic system 1710. The electronic system 1710 may include a controller 1711, an input/output unit 1712, and a memory 1713. The controller 1711, the input/output unit 1712 and the memory 1713 may be coupled with one another through a bus 1715 providing a path through which data are transmitted.

For example but not limited to, the controller 1711 may include at least any one of at least one microprocessor, at least one digital signal processor, at least one microcontroller, and logic devices capable of performing the same functions as these components. At least one of the controller 1711 and the memory 1713 may include at least any one of the semiconductor package module according to the embodiments of the present disclosure. The input/output unit 1712 may include at least one selected among a keypad, a keyboard, a display device, a touch screen and so forth. The memory 1713 is a device for storing data. The memory 1713 may store data and/or commands to be executed by the controller 1711, and the likes.

The memory 1713 may include a volatile memory device such as a DRAM and/or a nonvolatile memory device such as a flash memory. For example, a flash memory may be mounted to an information processing system such as a mobile terminal or a desk top computer. The flash memory may constitute a solid state disk (SSD). In this example, the electronic system 1710 may stably store a large amount of data in a flash memory system.

The electronic system 1710 may further include an interface 1714 configured to transmit and receive data to and from a communication network. The interface 1714 may be a wired or wireless type. For example, the interface 1714 may include an antenna or a wired or wireless transceiver.

The electronic system 1710 may be realized as a mobile system, a personal computer, an industrial computer or a logic system performing various functions. For example, the mobile system may be any one of a personal digital assistant (PDA), a portable computer, a tablet computer, a mobile phone, a smart phone, a wireless phone, a laptop computer, a memory card, a digital music system and an information transmission/reception system, etc.

In an embodiment, wherein the electronic system 1710 is an equipment capable of performing wireless communication, the electronic system 1710 may be used in a communication system such as, for example but not limited to, CDMA (code division multiple access), GSM (global system for mobile communications), NADC (north American digital cellular), E-TDMA (enhanced-time division multiple access), WCDMA (wideband code division multiple access), CDMA2000, LTE (long term evolution) and Wibro (wireless broadband Internet).

Figure 10:
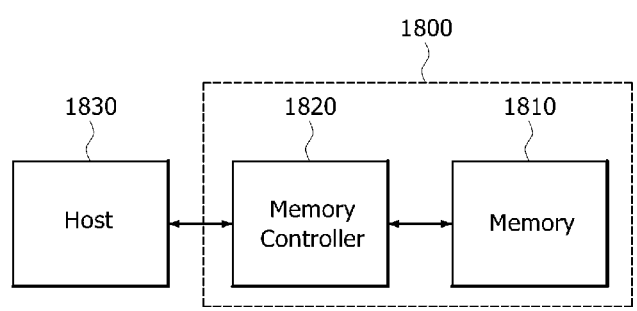
FIG. 10 is a block diagram illustrating a representation of an example of an electronic system including at least one of the semiconductor package modules in accordance with some of the embodiments.

Referring to FIG. 10, the semiconductor package module in accordance with the embodiments may be provided in the form of a memory card 1800. For example, the memory card 1800 may include a memory 1810 such as a nonvolatile memory device and a memory controller 1820. The memory 1810 and the memory controller 1820 may store data or read stored data. The memory 1810 may include at least any one among nonvolatile memory devices to which the packaging technology of the embodiments of the present disclosure is applied. The memory controller 1820 may control the memory 1810 such that stored data is read out or data is stored in response to a read/write request from a host 1830.

The embodiments of the present disclosure have been disclosed above for illustrative purposes. Those of ordinary skill in the art will appreciate that various modifications, additions, and substitutions are possible, without departing from the scope and spirit of the present disclosure as disclosed in the accompanying claims.

What is claimed is:

1. A semiconductor package module comprising:
a first substrate;
a second substrate disposed to face the first substrate; and
an interconnection member electrically connecting the first substrate to the second substrate and including a plurality of wires,
wherein portions of the plurality of wires are twisted and wound together and are bent to extend in a predetermined direction,
wherein the plurality of wires include a first wire portion and a second wire portion;
wherein the first wire portion includes a first line portion disposed to extend from the first substrate toward the second substrate and a first wave portion bent in the predetermined direction with a wave shape;
wherein the second wire portion includes a second line portion disposed to extend from the second substrate toward the first substrate and a second wave portion bent in the predetermined direction with a wave shape;
wherein the first wave portion and the second wave portion are twisted and wound together into a spiral shape; and
wherein an end of the first wave portion opposite to the first line portion and an end of the second wave portion opposite to the second line portion are covered by a protection member.

2. The semiconductor package module of claim 1, wherein each of the wires includes a plurality of strands.

3. A semiconductor package module of claim 1, wherein the first substrate or the second substrate includes a printed circuit board (PCB), an organic substrate or an insulation substrate.

4. The semiconductor package module of claim 1, wherein the protection member has a tube shape.

5. The semiconductor package module of claim 1, wherein the protection member includes polymer containing silicone.

6. The semiconductor package module of claim 1,
wherein the plurality of wires include a first wire portion, a second wire portion, a third wire portion and a fourth wire portion;
wherein the predetermined direction is a first direction parallel with surfaces of the first and second substrates;
wherein the first wire portion includes a first wave portion extending from the second substrate toward the first substrate and a second wave portion extending from the first wave portion in the first direction;
wherein the second wire portion includes a third wave portion extending from the first substrate toward the second substrate and a fourth wave portion extending from the third wave portion in the first direction;
wherein the third wire portion includes a fifth wave portion extending from the second substrate toward the first substrate and a sixth wave portion extending from the fifth wave portion in a second direction opposite to the first direction;
wherein the fourth wire portion includes a seventh wave portion extending from the first substrate toward the second substrate and a eighth wave portion extending from the seventh wave portion in the second direction;
wherein the first and fifth wave portions are twisted and wound together in a spiral shape to provide a first end of the interconnection member;
wherein the second and fourth wave portions are twisted and wound together in a spiral shape to provide a second end of the interconnection member;
wherein the third and seventh wave portions are twisted and wound together in a spiral shape to provide a third end of the interconnection member; and
wherein the sixth and eighth wave portions are twisted and wound together in a spiral shape to provide a fourth end of the interconnection member.

7. The semiconductor package module of claim 6, further comprising protection members covering the second and fourth ends, respectively.

8. The semiconductor package module of claim 1,
wherein each of the protection members includes a polymer containing silicone.

9. The semiconductor package module of claim 1, wherein the interconnection member includes gold (Au), silver (Ag) or copper (Cu).

10. A semiconductor package module comprising:
a circuit substrate having a surface;
a bonding pad disposed on the surface;
a semiconductor package including a semiconductor chip and disposed to face the bonding pad of the circuit substrate; and
an interconnection member electrically connecting the bonding pad of the circuit substrate to the semiconductor package and including a plurality of wires,
wherein portions of the plurality of wires are twisted and wound together and are bent to extend in a predetermined direction,
wherein the plurality of wires include a first wire portion and a second wire portion;
wherein the first wire portion includes a first line portion disposed to extend from the bonding pad toward the second substrate pad and a first wave portion bent in the predetermined direction with a wave shape;
wherein the second wire portion includes a second line portion disposed to extend from the second substrate pad toward the bonding pad and a second wave portion bent in the predetermined direction with a wave shape;
wherein the first wave portion and the second wave portion are twisted and wound together into a spiral shape; and
wherein an end of the first wave portion opposite to the first line portion and an end of the second wave portion opposite to the second line portion are covered by a protection member.

11. The semiconductor package module of claim 10, wherein each of the wires includes a plurality of strands.

12. The semiconductor package module of claim 10, wherein the circuit substrate includes a printed circuit board (PCB), an organic substrate or an insulation substrate.

13. The semiconductor package module of claim 10, wherein the semiconductor package includes a package substrate and the semiconductor chip is mounted on the package substrate;
wherein the package substrate includes a first surface and a first substrate pad is disposed on the first surface of the package substrate,
wherein the package substrate includes a second surface and a second substrate pad connected to an end of the interconnection member is disposed on the second surface of the package substrate,
wherein the first surface is opposite to the second surface.

14. The semiconductor package module of claim 10, wherein the protection member includes a polymer containing silicone.

15. The semiconductor package module of claim 13, wherein the plurality of wires include a first wire portion, a second wire portion, a third wire portion and a fourth wire portion;
wherein the predetermined direction is a first direction parallel with surfaces of the first and second substrates;
wherein the first wire portion includes a first wave portion extending from the second substrate pad toward the bonding pad and a second wave portion extending from the first wave portion in the first direction;
wherein the second wire portion includes a third wave portion extending from the bonding pad toward the second substrate pad and a fourth wave portion extending from the third wave portion in the first direction;
wherein the third wire portion includes a fifth wave portion extending from the second substrate pad toward the bonding pad and a sixth wave portion extending from the fifth wave portion in a second direction opposite to the first direction;
wherein the fourth wire portion includes a seventh wave portion extending from the bonding pad toward the second substrate pad and a eighth wave portion extending from the seventh wave portion in the second direction;
wherein the first and fifth wave portions are twisted and wound together in a spiral shape to provide a first end of the interconnection member;
wherein the second and fourth wave portions are twisted and wound together in a spiral shape to provide a second end of the interconnection member;
wherein the third and seventh wave portions are twisted and wound together in a spiral shape to provide a third end of the interconnection member; and
wherein the sixth and eighth wave portions are twisted and wound together in a spiral shape to provide a fourth end of the interconnection member.

16. The semiconductor package module of claim 15, further comprising protection members covering the second and fourth ends, respectively.

17. The semiconductor package module of claim 16, wherein each of the protection members includes a polymer containing silicone.

18. The semiconductor package module of claim 10, wherein the interconnection member includes gold (Au), silver (Ag) or copper (Cu).

* * * * *